(12) United States Patent
Kim (10) Patent No.: US 8,040,051 B2
(45) Date of Patent: Oct. 18, 2011

(54) ORGANIC LIGHT EMITTING DISPLAY AND METHOD OF MANUFACTURING THE SAME

(75) Inventor: Eun-Ah Kim, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 438 days.

(21) Appl. No.: 11/854,119

(22) Filed: Sep. 12, 2007

(65) Prior Publication Data
US 2008/0224599 A1 Sep. 18, 2008

(30) Foreign Application Priority Data
Mar. 13, 2007 (KR) .................. 10-2007-0024622

(51) Int. Cl.
*H01J 1/62* (2006.01)
*H01J 63/04* (2006.01)
*H01J 17/00* (2006.01)

(52) U.S. Cl. ........ 313/506; 313/504; 313/505; 313/483; 313/498; 313/500; 445/24; 445/25

(58) Field of Classification Search .................. None
See application file for complete search history.

(56) References Cited

U.S. PATENT DOCUMENTS

| | | | | |
|---|---|---|---|---|
| 6,762,564 B2 * | 7/2004 | Noguchi et al. | ........... | 315/169.1 |
| 7,576,482 B2 * | 8/2009 | Oh | ................................ | 313/500 |
| 2005/0179377 A1 * | 8/2005 | Shitagami et al. | ............. | 313/512 |
| 2005/0285987 A1 * | 12/2005 | Azumada et al. | ................ | 349/43 |
| 2006/0108587 A1 * | 5/2006 | Lee et al. | ......................... | 257/72 |
| 2008/0218062 A1 * | 9/2008 | Kim | ............................... | 313/504 |

FOREIGN PATENT DOCUMENTS
KR 2003-64006 7/2003
KR 2007-15327 2/2007

OTHER PUBLICATIONS
U.S. Appl. No. 11/854,099, filed Sep. 12, 2007, Eun-Ah Kim, Samsung SDI Co., Ltd.

* cited by examiner

*Primary Examiner* — Natalie Walford
(74) *Attorney, Agent, or Firm* — H.C. Park & Associates, PLC (57) ABSTRACT

An organic light emitting display is capable of preventing or reducing a scratch and a short between the wire lines due to the scratch. The organic light emitting display includes a pixel substrate including an organic light emitting element formed on a pixel region and wire lines formed in a surrounding area of the pixel region; and a protrusion formed between the wire lines.

17 Claims, 8 Drawing Sheets

ORGANIC LIGHT EMITTING DISPLAY AND METHOD OF MANUFACTURING THE SAME

CROSS-REFERENCE TO RELATED APPLICATION

This application claims the benefit of Korean Application No. 2007-24622, filed Mar. 13, 2007 in the Korean Intellectual Property Office, the disclosure of which is incorporated herein by reference.

BACKGROUND OF THE INVENTION

1. Field of the Invention

Aspects of the present invention relate to an organic light emitting display, and more particularly, to an organic light emitting display and a method of manufacturing the same to prevent or reduce a scratch on wire lines thereof.

2. Description of the Related Art

An organic light emitting display is a self-emitting display that uses a phenomenon in which electrons and holes injected into an organic material through an anode and a cathode, respectively, are recombined to form excitons. The excitons thereby generate a light beam with a specific wavelength by releasing energy. The organic light emitting display does not require a separate light source, such as a backlight, resulting in low or lower power consumption. Furthermore, since a wide viewing angle and a fast response time of the organic light emitting display can be easily ensured, the organic light emitting display is expected to be a next generation display.

In terms of a driving method, the organic light emitting display is classified into a passive matrix type and an active matrix type. In recent years, the active matrix type organic light emitting display has become more prevalent over the passive matrix type organic light emitting display. The active matrix type organic light emitting display enables realization of low power consumption, high definition, fast response time, wide viewing angle, and light thin film characteristics.

In an active matrix type organic light emitting display, a pixel region is formed on a pixel substrate so as to display an image. Also, wire lines, and data and scan drivers to operate the pixel region using signals input through pads of the wire lines, are formed in a surrounding area of the pixel region. Pixels in the pixel region, each of which is a basic unit for image display, are arranged in a matrix form, and an organic light emitting element is disposed for each pixel. The organic light emitting element includes a first pixel electrode of a positive polarity and a second pixel electrode of a negative polarity that are sequentially formed with an emitting layer interposed therebetween. The emitting layer includes a red (R), green (G), and/or blue (B) organic material. A thin film transistor (TFT) is in contact with the organic light emitting element so that the each pixel can be separately controlled.

Figure 5A:
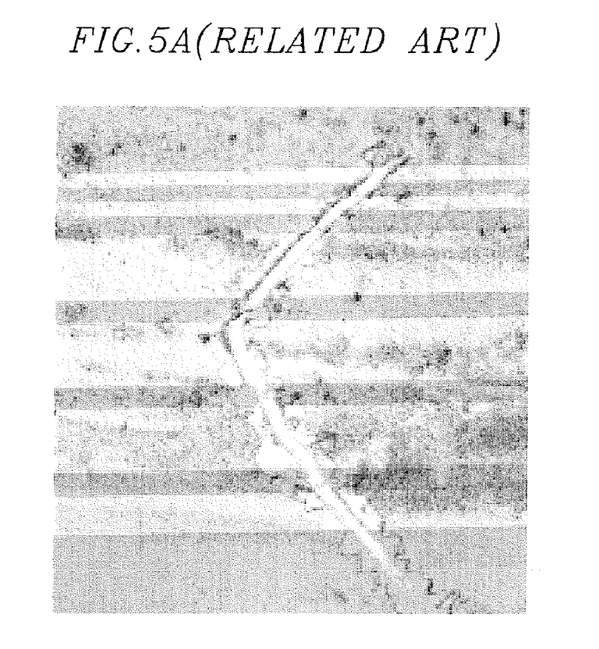
FIG. 5A is a microscope image.
Figure 5B:
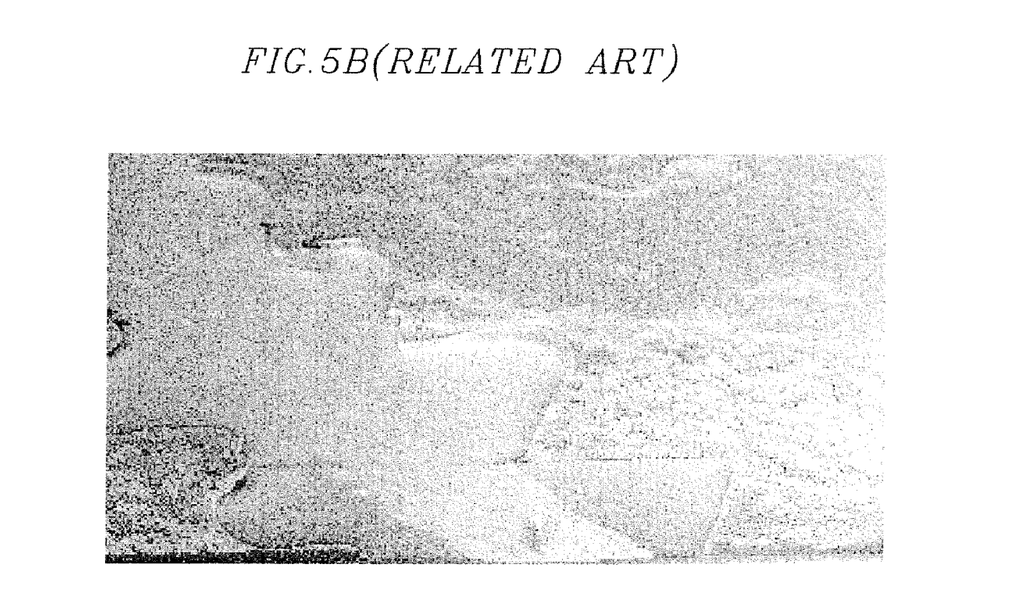
FIG. 5B is a focused ion beam (FIB) image.
Figure 5C:
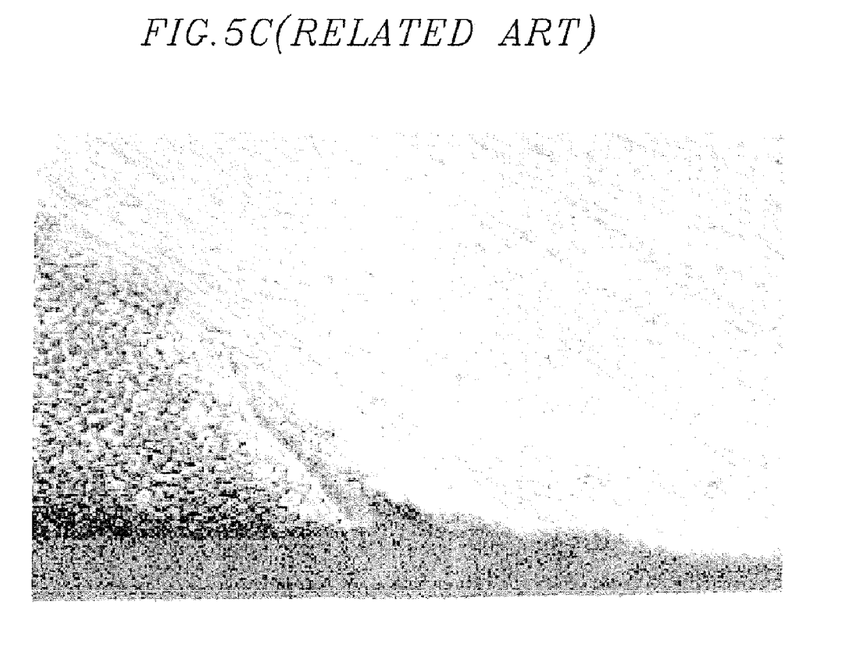
FIG. 5C is a partially enlarged image of FIG. 5B.

The pixel substrate of the organic light emitting display is sealed by a sealing substrate to protect the pixels. Although the organic light emitting display is sealed, the wire lines and the pads are not sealed in order to be used to input external signals. Accordingly, the wire lines and the pads may be easily damaged by an external physical impact. In particular, a scratch may be produced on the wire lines as shown in FIGS. 5A to 5C to cause a short between the wire lines so that driving of the pixel deteriorates.

SUMMARY OF THE INVENTION

Aspects of the present invention provides an organic light emitting display capable of preventing or reducing a scratch on wire lines and a short between the wire lines due to the scratch and other advantages.

According to an aspect of the present invention, an organic light emitting display includes: a pixel substrate including an organic light emitting element formed on a pixel region and wire lines formed in a surrounding area of the pixel region; and a protrusion formed between the wire lines.

In the above aspect of the present invention, the protrusion may be made of a material having a Mohs hardness that is larger than that of the wire lines. For example the protrusion may be made of silicon nitride and/or silicon oxide.

In addition, the organic light emitting element may have a first pixel electrode, an organic light emitting layer, and a second pixel electrode that are sequentially stacked. The organic light emitting display may further include a sealing substrate formed on the pixel substrate to protect the pixel region.

According to another aspect of the present invention, an organic light emitting display includes: a thin film transistor which is formed on a pixel region of a pixel substrate and includes an active layer, a gate insulating layer formed on a first surface of the pixel substrate to cover the active layer, a gate electrode formed on the gate insulating layer, an interlayer insulating layer formed on the gate insulating layer to cover the gate electrode, and source and drain electrodes formed on the interlayer insulating layer; a planarization layer to cover the thin film transistor and is formed on the interlayer insulating layer; an organic light emitting element formed on the planarization layer; and wire lines formed in a surrounding area of the pixel region, wherein a concave portion is formed in the interlayer insulating layer in the surrounding area of the pixel region, and the wire lines are disposed in the concave portion.

In the above aspect of the present invention, the wire lines may have a height that is lower than that of a surface of the interlayer insulating layer. For example, the interlayer insulating layer may be made of silicon nitride and/or silicon oxide In addition, a concave portion may be formed in the gate insulating layer disposed under the concave portion of the interlayer insulating layer. The planarization layer may fill the concave portion. The organic light emitting element may have a first pixel electrode, an organic light emitting layer, and a second pixel electrode that are sequentially stacked. The organic light emitting display may further include a sealing substrate formed on the pixel substrate to protect the pixel region.

According to another aspect of the present invention, a method of manufacturing an organic light emitting display includes: forming an active layer of a pixel region on a pixel substrate; forming a gate insulating layer on a first surface of the pixel substrate to cover the active layer; forming a gate electrode on the gate insulating layer; forming an interlayer insulating layer on the gate insulating layer to cover the gate electrode; forming first and second contact holes to expose the active layer on the pixel region by patterning the interlayer insulating layer and the gate insulating layer and to simultaneously form a concave portion in a surrounding area of the pixel region; forming source and drain electrodes that are electrically connected to the active layer through the first and second contact holes on the interlayer insulating layer and simultaneously forming wire lines in the concave portion; forming a planarization layer on the interlayer insulating layer to fill the concave portion; and forming an organic light emitting element on the planarization layer.

The wire lines may have a height that is lower than that of a surface of the interlayer insulating layer. The interlayer insulating layer may be made of silicon nitride and/or silicon oxide. The organic light emitting element may have a first pixel electrode, an organic light emitting layer, and a second pixel electrode that are sequentially stacked.

According to another aspect of the present invention, an organic light emitting display includes a pixel substrate including a pixel region of a plurality of pixels; a plurality of trenches formed on the pixel substrate around a periphery of the pixel region; and a plurality of wire lines each formed in a corresponding one of the plurality of trenches.

According to another aspect of the present invention, a method of forming an organic light emitting display, includes forming a pixel substrate to include a pixel region of a plurality of pixels; forming a plurality of trenches on the pixel substrate around a periphery of the pixel region; and forming a plurality of wire lines in a corresponding one of the plurality of trenches.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIGS. 5A, 5B, and 5C are views showing a scratch on wire lines of a related organic light emitting display, in which

DETAILED DESCRIPTION OF THE EMBODIMENTS

Reference will now be made in detail to the aspects of the present invention, examples of which are illustrated in the accompanying drawings, wherein like reference numerals refer to the like elements throughout. The aspects are described below in order to explain the present invention by referring to the figures.

In the figures, the dimensions of layers and regions may be exaggerated for clarity. It will also be understood that when a layer or element is referred to as being "on" or "over" another layer or substrate, it can be directly on the other layer or substrate, or intervening layers may also be present. Further, it will be understood that when a layer is referred to as being "under" or "below" another layer, it can be directly under, or one or more intervening layers may also be present.

Figure 1:
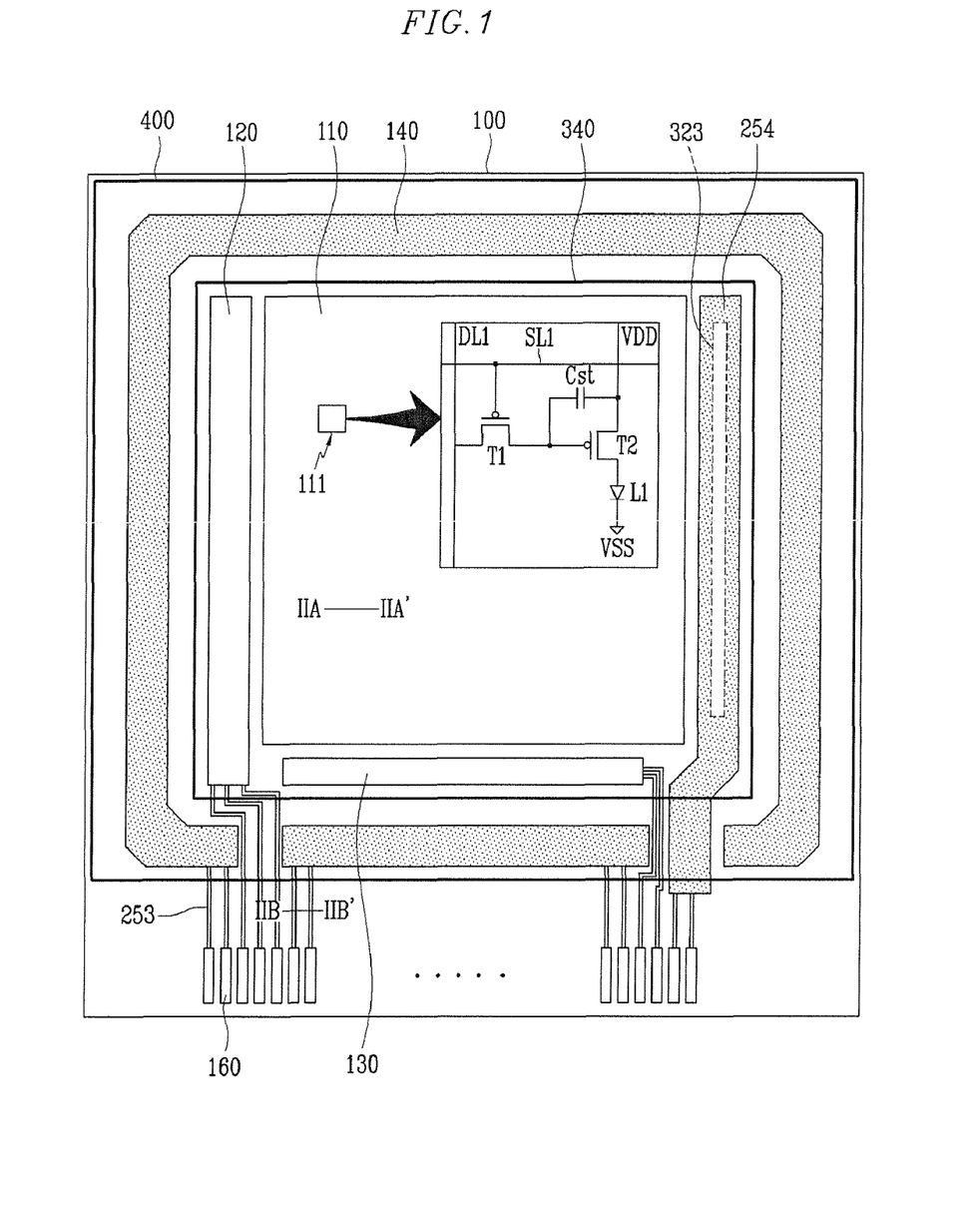
FIG. 1 is a top plan view showing an organic light emitting display according to aspects of the present invention.

First, an organic light emitting display according to an aspect of the present invention will be described with reference to FIGS. 1 and 2. Referring to FIG. 1, the organic light emitting display includes a pixel substrate 100, a pixel region 110 formed on the pixel substrate 100 to display an image, and pixels 111, each of which is a basic unit in displaying the image. The pixel region 110 and the pixels 111 are arranged in a matrix form.

In a surrounding area of the pixel region 110, the organic light emitting display further includes wire lines 253 having pads 160, a scan driver 120 and a data driver 130 connected to the wire lines 253 to drive the pixel region 110 by way of signals input through the pads 160, a power source line 140 to supply a power source voltage to the pixels 111 of the pixel region 110, and a second pixel electrode wire line 254 to supply an anode voltage to a second pixel electrode 340, which will be described later. In the aspect shown, the second pixel electrode 340 contacts the second pixel electrode wire line 254 through a via hole 323. The second pixel electrode 340 is formed on the entire pixel region 110 to supply the anode voltage to a plurality of the pixels 111 arranged in the pixel region 110. In addition, as shown in FIG. 1, the second pixel electrode 340 may be formed even on the scan driver 120 and data driver 130.

In the aspect shown, the pixel 111 includes a switching first thin film transistor (TFT) T1, a driving second TFT T2, a storage capacitor Cst, and an organic light emitting element L1, but is not limited thereto. For example, the pixel 111 may include two or more switching TFTs, driving TFTs, storage capacitors, and/or other elements.

The first TFT T1 is connected to a scan line SL1 and a data line DL1, respectively. The first TFT Ti transmits a data voltage that is input through the data line DL1 to the second TFT T2 according to the switching voltage that is input through the scan line SL1. The storage capacitor Cst is connected to the first TFT T1 and the power source line VDD, respectively. The storage capacitor Cst stores a voltage $V_{gs}$ corresponding to a difference between a voltage transmitted from the first TFT T1 and a voltage supplied to the power source line VDD.

The second TFT T2 is connected to the power source line VDD and the storage capacitor Cst, respectively. The second TFT T2 supplies an output current $I_d$ to the organic light emitting element L1, which is proportionate to a square of a difference between the voltage stored in the storage capacitor Cst and a threshold voltage $V_{th}$. The organic light emitting element L1 emits light by way of the output current $I_d$. In the aspect shown, the output current $I_d$ can be represented by the following Equation 1, in which β denotes a proportionality constant.

$$I_d = (\beta/2) \times (V_{gs} - V_{th})^2 \quad \text{[Equation 1]}$$

Referring to FIG. 1, a sealing substrate 400 is formed on the pixel substrate 100 to protect the pixel region 110.

Figure 2:
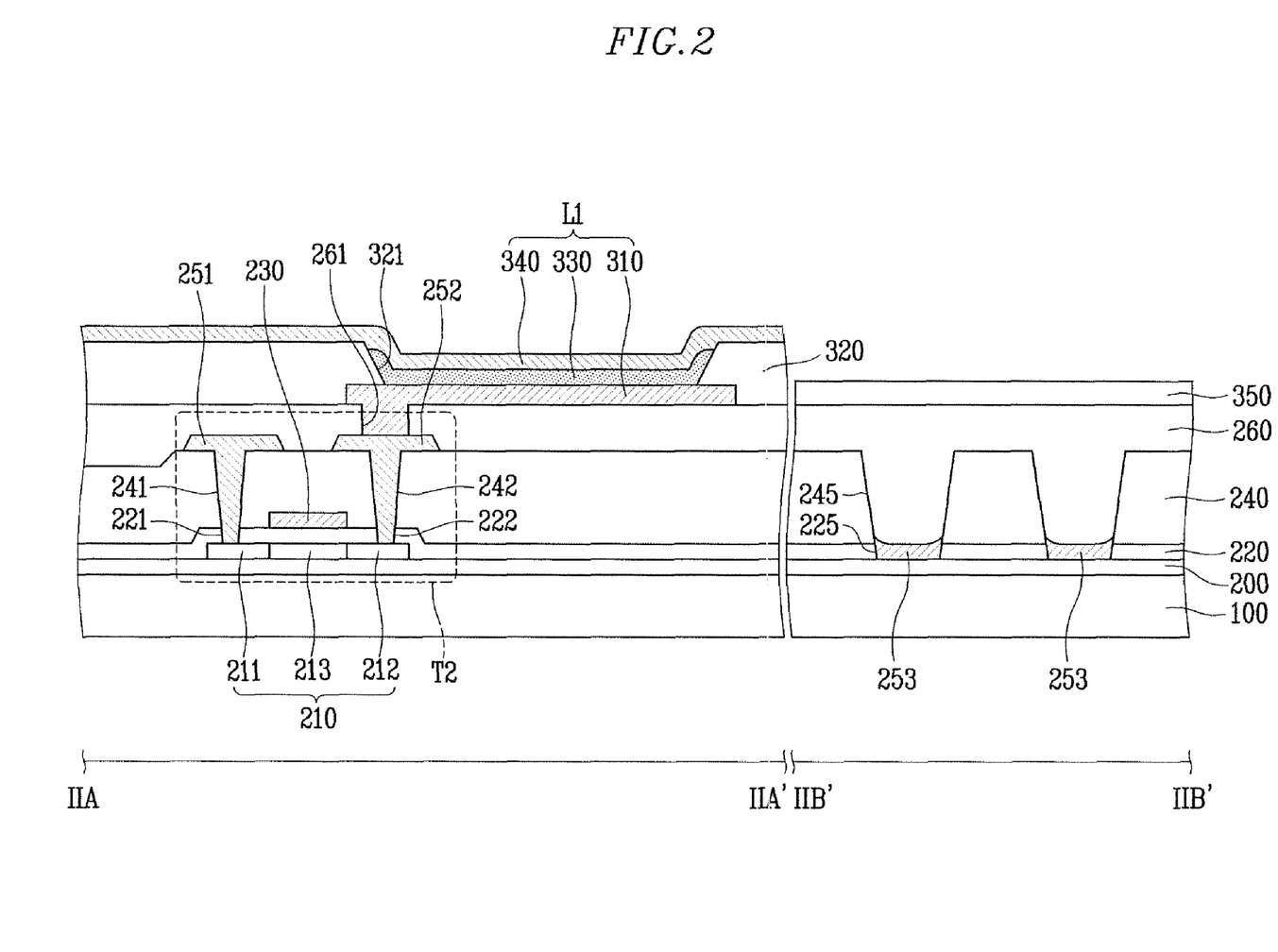
FIG. 2 is a cross-sectional view taken along lines II A-II A' and 11 B-II B' of an organic light emitting display according to one aspect of FIG. 1.

FIG. 2 is a cross-sectional view taken along lines II A-II A' and II B-II B' of an organic light emitting display according to one aspect of FIG. 1. Referring to FIG. 2, the structure of the pixels 111 on the pixel substrate 100 and of the wire lines 253 will be described in detail. As shown, a buffer layer 200 is formed on the substrate 100. Formed on the buffer layer 200 is an active layer 210 that includes source and drain regions 211 and 212, and a channel region 213 interposed therebetween. A gate insulting layer 220 is formed on the buffer layer 200 to cover the active layer 210, and a gate electrode 230 is formed on the gate insulating layer 220 on the active layer 210. An interlayer insulating layer 240 is formed on the gate insulating layer 220 to cover the gate electrode 230. In the interlayer insulating layer 240, a source electrode 251 and a drain electrode 252 are formed to be electrically connected to the source and drain regions 211 and 212 through first contact holes 221 and 241, and second contact holes 222 and 242, respectively formed in the gate insulating layer 220 and the interlayer insulating layer 240, to thereby constitute the second TFT T2.

In addition, concave portions (or trenches) 245 and 225 are formed in the interlayer insulating layer 240 and the gate insulating layer 220, respectively, in areas surrounding the pixel region 110 (see FIG. 1). Also, the wire lines 253 are formed in the concave portions 245 and 225 thereof. In the aspect shown, the wire lines 253 may be formed to have a lower height than that of a surface of the interlayer insulating layer 240, such that the interlayer insulating layer 240 protrudes between the wire lines 253. For example, the wire lines 253 are formed on lower portions of the concave portions 225 and 245.

In the aspect shown, the substrate 100 may be made of an insulating material or a metal material. Examples of the insulating material include glass, plastic, and/or other insulators, and examples of the metal material include stainless steel (SUS), and/or other metals. The buffer layer 200 prevents or reduces impurities of the substrate 100 from spreading when the active layer 210 is formed. For example, the buffer layer 200 may include a silicon nitride (SiN) layer or may be formed to have a stacked or layered structure that includes a silicon nitride (SiN) layer and a silicon oxide ($SiO_2$) layer.

The gate electrode 230 may be made of one or more metals. In an aspect of the present invention, the gate electrode 230 may be an MoW layer, an aluminum layer, a chromium layer, and/or an aluminum/chromium layer. The source and drain electrodes 251 and 252 may be made of metal layers such as a titanium/aluminum layer and/or a titanium/aluminum/titanium layer. The interlayer insulating layer 240 may be made of a material having a Mohs hardness that is larger than that of the wire lines 253. In various aspects, the interlayer insulating layer 240 may be silicon nitride or silicon oxide.

A planarization layer 260 is formed on the interlayer insulating layer 240 so as to cover the second TFT T2 and to fill the concave portions 225 and 245. A first pixel electrode 310 is formed on the planarization layer 260 and is electrically connected to the drain electrode 252 of the second TFT T2 through a via hole 261 formed in the planarization layer 260. Additionally, an organic light emitting layer 330 is formed on the first pixel electrode 310, and a second pixel electrode 340 is formed on the organic light emitting layer 330, to thereby constitute the organic light emitting element L1.

The first pixel electrode 310 is electrically separated from an adjacent first pixel electrode (not shown) of an adjacent pixel by a pixel defining layer 320. T e first pixel electrode 310 contacts the organic light emitting layer 330 through an opening portion 321 provided to the pixel defining layer 320. In the aspect shown, the first pixel electrode 310 injects holes, and the second pixel electrode 340 injects electrons to the organic light emitting layer 330, respectively.

The first pixel electrode 310 may include a first transparent electrode (not shown) made of indium tin oxide (ITO) and/or indium zinc oxide (IZO). The first pixel electrode 310 may further include a conductive reflective layer (not shown) and a second transparent electrode (not shown) on the first transparent electrode depending on a light emitting direction of the organic light emitting element L1. The reflective layer increases a light emitting efficiency of the organic light emitting display by reflecting light emitted from the organic light emitting layer 330. The reflective layer also improves an electrical conductivity of the first pixel electrode 310, for example. By way of example, the reflective layer may be made of aluminum (Al), an aluminum alloy, silver (Ag), a silver alloy, gold (Au), a gold alloy, and/or other material. The second transparent electrode suppresses oxidation of the reflective layer and improves a work function relationship between the organic light emitting layer 330 and the reflective layer. The second transparent electrode may be made of ITO and/or IZO, similar to the first transparent electrode.

The organic light emitting layer 330 may further include a light emitting layer to practically or efficiently emit light and an organic layer to effectively transmit carriers such as holes or electrons to the light emitting layer. In various aspects, the organic layer may be disposed on, over, or under the light emitting layer. By way of example, the organic layer may include one or more layers from among a hole injection layer and a hole transmission layer (that are formed between the light emitting layer and the first pixel electrode 310) and an electron transmission layer and an electron injection layer (that are formed between the light emitting layer and the second pixel electrode 340).

The second pixel electrode 340 may be made of a transparent conductive layer (not shown) or an opaque conductive layer (not shown) depending on a light emitting direction of the organic light emitting element L1. The transparent conductive layer may have a thickness of from 100 to 180 Å. In various aspects, the transparent conductive layer may be made of IZO, ITO, MgAg, or other material. In various aspects, the opaque conductive layer (not shown) may be made of Al, or other material.

According to this aspect, the concave portions 225 and 245 have the wire lines 253 disposed therein. The concave portions 225 and 245 are respectively formed in the gate insulating layer 220 and the interlayer insulating layer 240, for example. Accordingly, the interlayer insulating layer 240, or a portion thereof, protrudes between the wire lines 253. Also, the interlayer insulating layer 240 has a Mohs hardness that is larger than that of the wire lines 253. Therefore, even though the planarization layer 260 on the wire lines 253 has the potential to be damaged by an external physical impact because of the wire lines 253 not being sealed by the sealing substrate 400, the wire lines 253 can be protected from the impact by the protruding interlayer insulating layer 240, or the protruding portion thereof. As a result, a scratch on the wire lines 253 and a resulting short or an open circuit between the wire lines 253 can be prevented or reduced, and a deterioration in the driving of the pixel can also be prevented or reduced.

Figure 3:
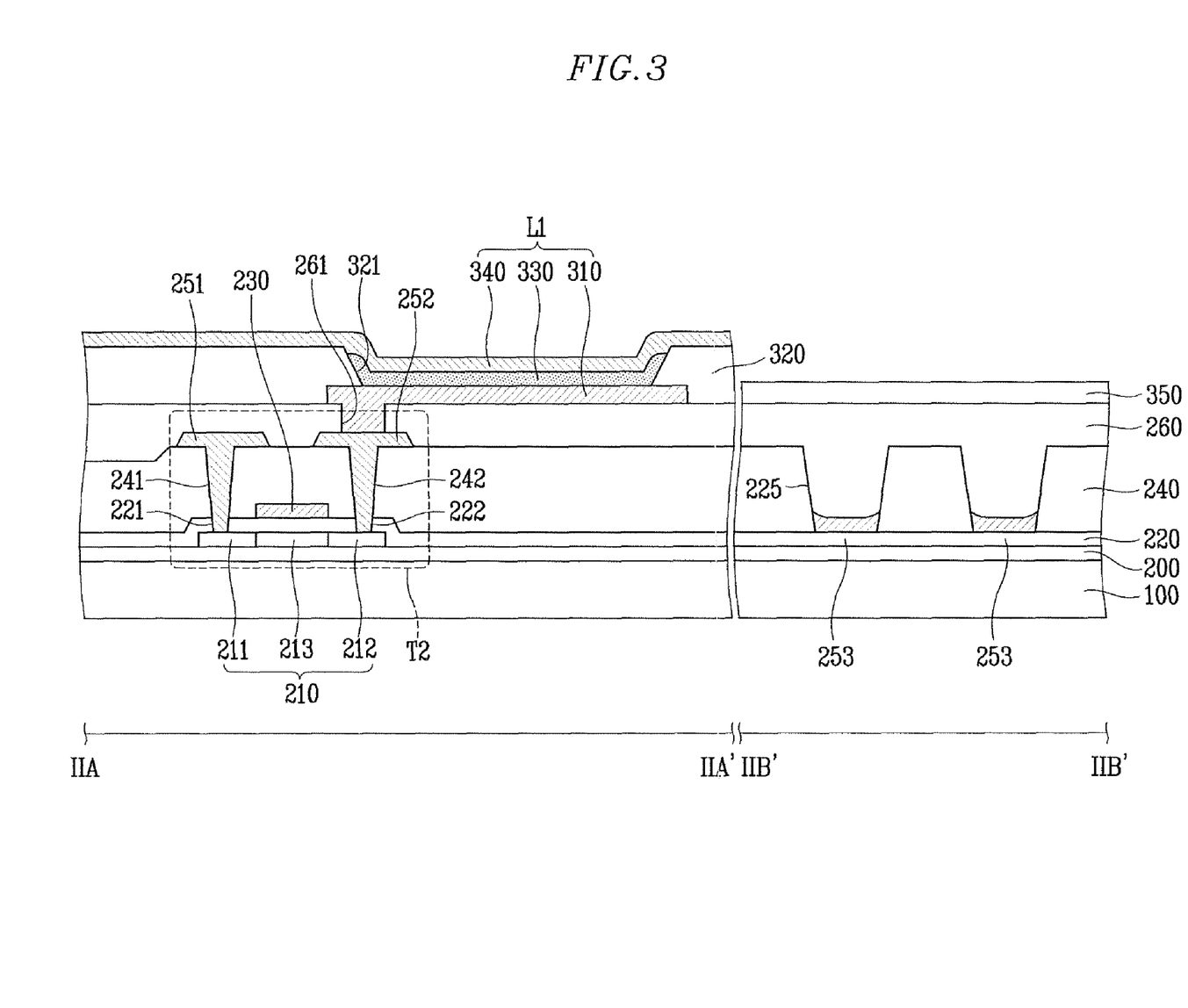
FIG. 3 is a cross-sectional view taken along line II A-II A' and II B-II B' of an organic light emitting display according to another aspect of FIG. 1.

In this aspect, if the concave portions 245 and 225 are formed in the interlayer insulating layer 240 and the gate insulating layer 220, respectively, is taken as an example, the concave portion 245 may be formed only in the interlayer insulating layer 240 as shown in FIG. 3. In the aspect shown, the wire lines 253 are formed to have a lower height than that of the surface of the interlayer insulating layer 240 such that a portion of the interlayer insulating layer 240 protrudes between the wire lines 253. By way of example, the wire lines 253 are formed on a lower portion of the concave portion 245. Also, in this aspect, the wire lines 253 are formed on the gate insulating layer 220, which does not have the concave portion 225.

Figure 4A:
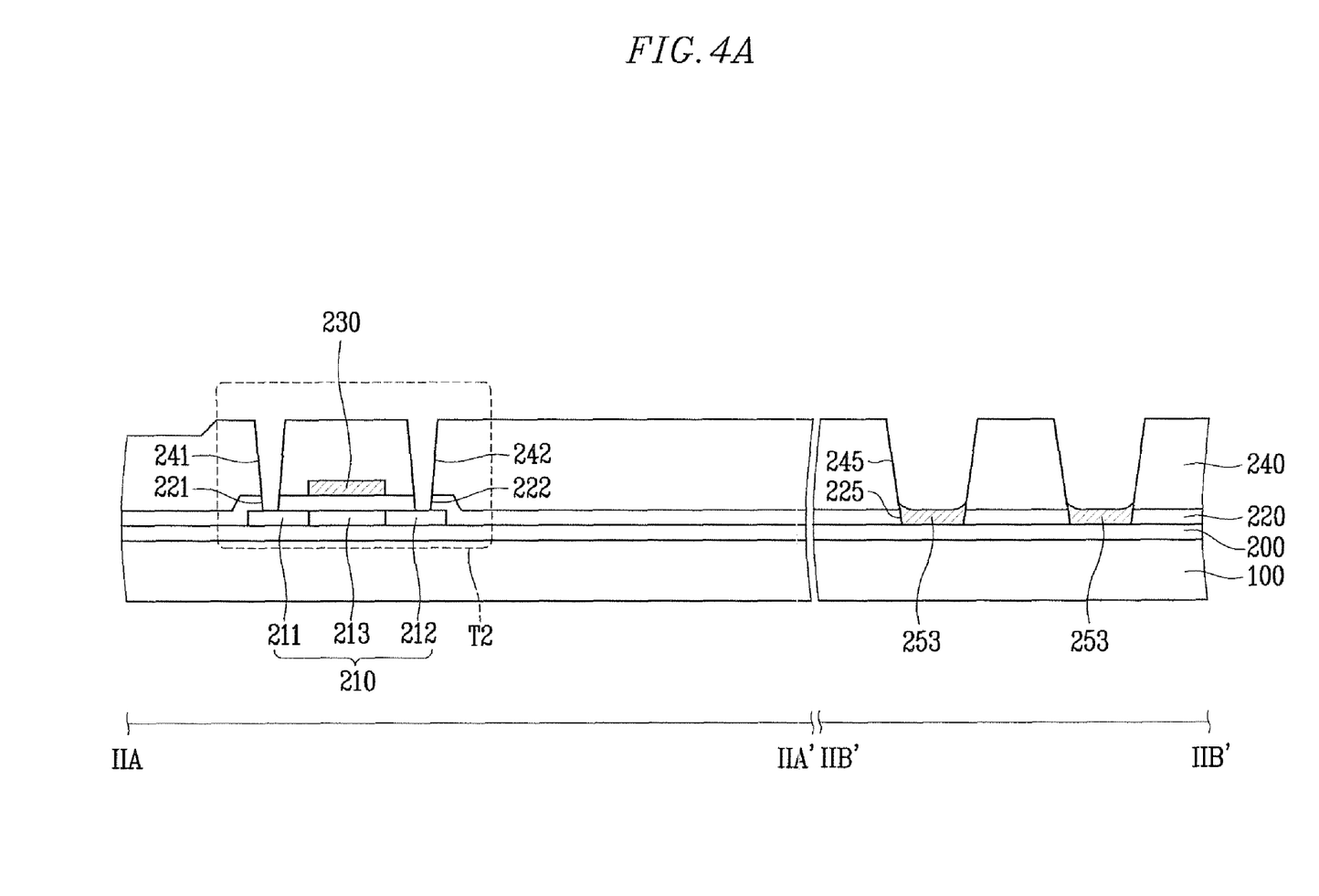
FIGS. 4A, 4B, and 4C are process views to explain a method of manufacturing an organic light emitting display according to an aspect of the present invention.

Next, a method of manufacturing an organic light emitting display according to an aspect of the present invention will be described with reference to FIGS. 4A, 4B, and 4C. Referring to FIG. 4A, a buffer layer 200 is formed on a pixel substrate 100. In various aspects, the buffer layer 200 is made of a silicon nitride (SiN) or a stacked structure including a silicon nitride (SiN) layer and a silicon oxide ($SiO_2$) layer. Next, an amorphous silicon layer is deposited on the buffer layer 200, and a crystallization process and a patterning process are performed thereon, to thereby form an active layer 210 on a pixel region 110 (see FIG. 1). Next, a gate insulating layer 220 is formed on the buffer layer 200 to cover the active layer 210, a metal layer is deposited on the gate insulating layer 220, and a patterning process is performed thereon to form a gate electrode 230 on the gate insulating layer 220. In various aspects, the metal layer on the gate insulating layer 220 includes one selected from a MoW layer, an aluminum layer, a chromium layer, and an aluminum/chromium layer. However, other metals are within the scope of the present invention.

Next, impurities are doped into both sides of the active layer 210 to form source and drain electrodes 211 and 212, respectively. Next, an interlayer insulating layer 240 made of silicon nitride (SiN) or silicon oxide (SiO) is formed on the gate insulating layer 220 to cover the gate electrode 230. Also, the interlayer insulating layer 240 and the gate insulating layer 220 are patterned to form first contact holes 221 and 241, respectively, to expose the source region 211, and to form second contact holes 222 and 242, respectively, to expose the drain region 212. In the aspect shown, the interlayer insulating layer 240 and the gate insulating layer 220 in the surrounding area of the pixel region 110 are simultaneously patterned to form concave portions 245 and 225 in the interlayer insulating layer 240 and the gate insulating layer 220, respectively.

Figure 4B:
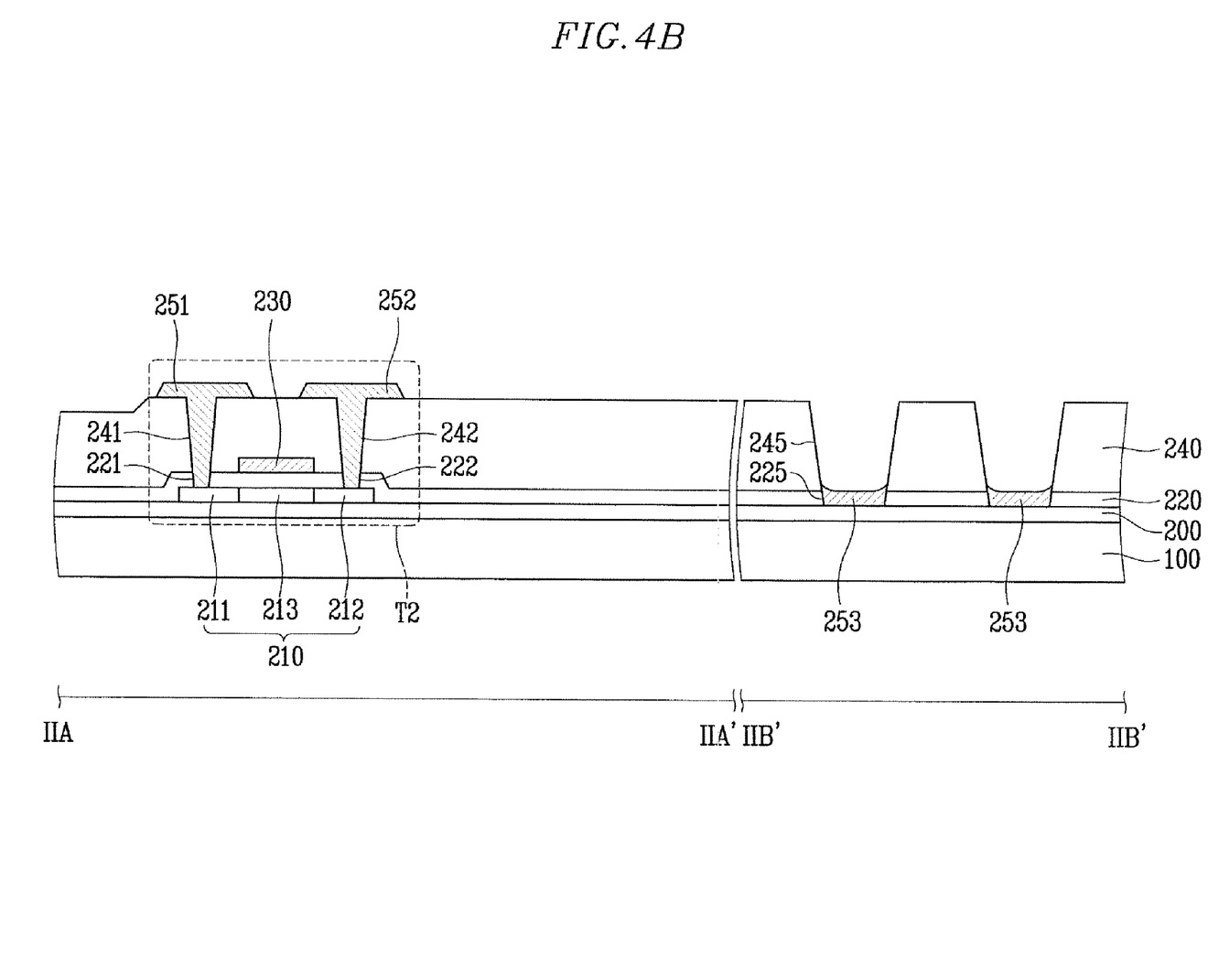

Referring to FIG. 4B, a metal layer is deposed on or in the interlayer insulating layer 240, the first contact holes 221 and 241, the second contact holes 222 and 242, and the concave portions 225 and 245, and a patterning process is performed thereon. In various aspects, the metal layer includes a titanium/aluminum layer or a titanium/aluminum/titanium layer. Source and drain electrodes 251 and 252 are then formed to form a second TFT T2, and wire lines 253 are formed in the concave portions 225 and 245. The source and drain electrodes 251 and 252 are electrically connected to the source and drain regions 211 and 212, respectively. Also, by way of example, the wire lines 253 can be formed at lower portions of the concave portions 225 and/or 245.

Figure 4C:
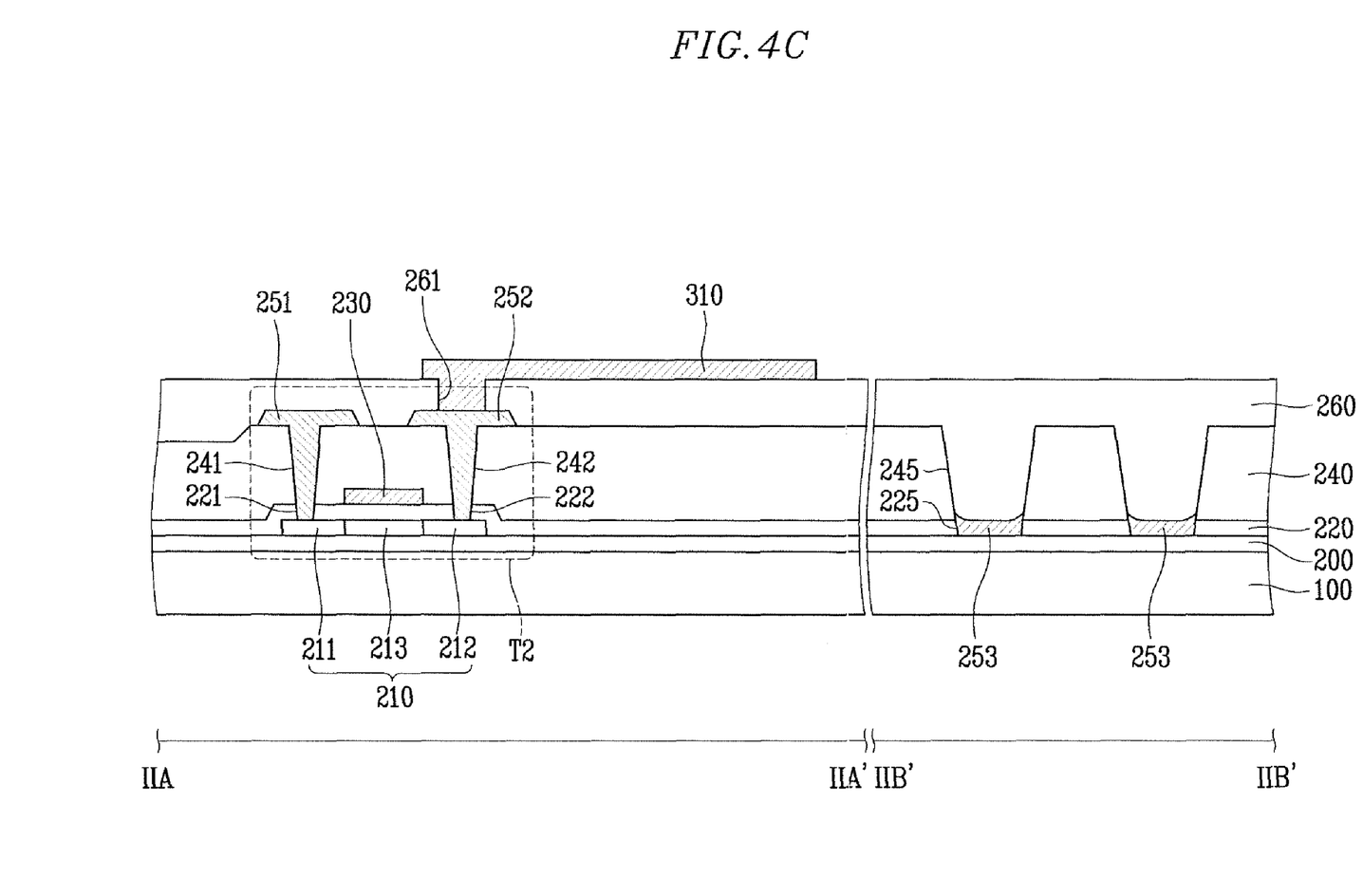

Referring to FIG. 4C, a planarization layer 260 is formed on the interlayer insulating layer 240 to cover the second TFT T2. The planarization layer 260 fills in the concave portions 225 and 245. Next, the planarization layer 260 is patterned to form via holes 261 to expose the drain electrode 252 of the second TFT T2. Next, a first pixel electrode material layer is deposited on the planarization layer 260 and the via holes 261, and is patterned by an etching process so that a first pixel electrode 310 is formed that is electrically connected to the drain electrode 252.

Next, referring back to FIG. 2, a pixel defining layer 320 is formed on the planarization layer 260 to cover the first pixel electrode 310. Next, a patterning process is performed on the pixel defining layer 320 to form an opening portion 321 to expose the first pixel electrode 310. Also, an organic light emitting layer 330 is formed on the first pixel electrode 310 of the opening portion 321. Then, a second pixel electrode 340 is formed thereon, to thereby constitute an organic light emitting element L1.

According to aspects of the present invention, the wire lines 253 are disposed in the concave portions 225 and/or 245 of gate insulating layer 220 and the interlayer insulating layer 240, respectively. The concave portions 225 and 245 can be simultaneously formed when the first contact holes 221 and 241 and the second contact holes 222 and 242 are formed in the gate insulating layer 220 and the interlayer insulating layer 240, respectively, so that an additional forming process is not required.

In various aspects, the gate insulating layer may partially fill the concave portions, in addition to the planarization layer.

In various aspects, the concave portion or the trench may be any shape, or at any incline.

In various aspects, the pads 160 of the wires lines 253 may be exposed for electrical contact. In other aspects, portions of the wire lines 253 may be exposed through the planarization layer 260, and/or other layer, for example.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. An organic light emitting display, comprising:
    a thin film transistor which is formed on a pixel region of a pixel substrate and which includes an active layer, a gate insulating layer formed on a first surface of the pixel substrate to cover the active layer, a gate electrode formed on the gate insulating layer, an interlayer insulating layer formed on the gate insulating layer to cover the gate electrode, and source and drain electrodes formed on the interlayer insulating layer;
    a planarization layer to cover the thin film transistor and is formed on the interlayer insulating layer;
    an organic light emitting element formed on the planarization layer; and
    wire lines formed in a surrounding area of the pixel region, wherein a concave portion is formed in the interlayer insulating layer in the surrounding area of the pixel region, and the wire lines are disposed in the concave portion.

2. The organic light emitting display of claim 1, wherein the wire lines have a height that is lower than that of a surface of the interlayer insulating layer.

3. The organic light emitting display of claim 1, wherein the interlayer insulating layer is made of silicon nitride and/or silicon oxide.

4. The organic light emitting display of claim 2, further comprising a concave portion formed in the gate insulating layer disposed under the concave portion of the interlayer insulating layer.

5. The organic light emitting display of claim 2, wherein the planarization layer fills the concave portion.

6. The organic light emitting display of claim 1, wherein the organic light emitting element has a first pixel electrode, an organic light emitting layer, and a second pixel electrode that are sequentially stacked.

7. The organic light emitting display of claim 1, further comprising a sealing substrate formed on the pixel substrate to protect the pixel region.

8. A method of manufacturing an organic light emitting display, comprising:
    forming an active layer on a pixel region of a pixel substrate;
    forming a gate insulating layer on a first surface of the pixel substrate to cover the active layer;
    forming a gate electrode on the gate insulating layer;
    forming an interlayer insulating layer on the gate insulating layer to cover the gate electrode;
    forming first and second contact holes to expose the active layer on the pixel region by patterning the interlayer insulating layer and the gate insulating layer, and simultaneously forming a concave portion in a surrounding area of the pixel region;
    forming source and drain electrodes that are electrically connected to the active layer through the first and second contact holes on the interlayer insulating layer, and simultaneously forming wire lines in the concave portion;

forming a planarization layer on the interlayer insulating layer to fill the concave portion; and forming an organic light emitting element on the planarization layer.

9. The method of claim 8, wherein the wire lines have a height that is lower than that of a surface of the interlayer insulating layer.

10. The method of claim 8, wherein the interlayer insulating layer is made of silicon nitride and/or silicon oxide.

11. The method of claim 8, wherein the organic light emitting element has a first pixel electrode, an organic light emitting layer, and a second pixel electrode that are sequentially stacked.

12. An organic light emitting display, comprising:
   a pixel substrate including a pixel region comprising pixels;
   a buffer layer formed on the pixel substrate;
   a gate insulating layer formed on the buffer layer;
   an interlayer insulating layer formed on the gate insulating layer,
   trenches formed in at least one of the interlayer insulating layer and the gate insulating layer, the trenches disposed around the periphery of the pixel region; and
   wire lines that are each formed in a corresponding one of the trenches, so as to have a lower height than a portion of the interlayer insulating layer that protrudes between adjacent ones of the wire lines,
   wherein the periphery of the pixel region does not have an organic light emitting element formed thereon.

13. The organic light emitting display of claim 12, wherein the interlayer insulating layer is made of silicon nitride and/or silicon oxide.

14. The organic light emitting display of claim 12, further comprising a thin film transistor of each of the pixels, the thin film transistor having a via hole through the interlayer insulating layer, and wherein the trenches are simultaneously formed with the via hole.

15. The organic light emitting display of claim 12, further comprising contact holes formed in the gate insulating layer and the interlayer insulating layer, wherein the concave portions are simultaneously formed with the contact holes.

16. A method of forming an organic light emitting display, comprising:
   forming a pixel substrate to include a pixel region of a plurality of pixels;
   forming a buffer layer on the pixel substrate;
   forming a gate insulating layer on the buffer layer;
   forming an interlayer insulating layer on the gate insulating layer;
   forming trenches in at least one of the gate insulating layer and the interlayer insulating layer, the trenches disposed around the periphery of the pixel region; and
   forming wire lines in corresponding ones of the trenches, such that the wire lines have a lower height than a portion of the interlayer insulating layer that protrudes between adjacent ones of the wire lines,
   wherein the periphery of the pixel region does not have an organic light emitting element formed thereon.

17. The method of forming an organic light emitting display of claim 16, further comprising:
   forming a thin film transistor of each of the pixels, the thin film transistor having a via hole through the interlayer insulating layer; and
   forming the trenches simultaneously with the via hole.

\* \* \* \* \*